United States Patent
Hsieh et al.

(10) Patent No.: US 6,207,501 B1
(45) Date of Patent: Mar. 27, 2001

(54) METHOD OF FABRICATING A FLASH MEMORY

(75) Inventors: Shou-Wei Hsieh; Shiou-Han Liaw, both of Hsinchu (TW)

(73) Assignee: United Microelectronics. Corp., Hsinchu (TW)

(*) Notice: Subject to any disclaimer, the term of this patent is extended or adjusted under 35 U.S.C. 154(b) by 0 days.

(21) Appl. No.: 09/363,879

(22) Filed: Jul. 29, 1999

(30) Foreign Application Priority Data

Dec. 15, 1998 (TW) .................................................. 87120785

(51) Int. Cl.⁷ ..................... H01L 21/336; H01L 21/8238
(52) U.S. Cl. .......................... 438/258; 438/230; 438/257
(58) Field of Search ..................................... 438/257, 258, 438/197, 265, 266, 275, 200, 229, 201, 230, 231, 527

(56) References Cited

U.S. PATENT DOCUMENTS 5,897,348 * 4/1999 Wu ........................................ 438/200
5,911,105 * 6/1999 Sasaki .................................. 438/258

* cited by examiner

Primary Examiner—Matthew Smith
Assistant Examiner—Lex H. Malsawma

(57) ABSTRACT

A method of fabricating a flash memory is disclosed: firstly, a P-type silicon substrate is divided into a PMOS area, an NMOS area, and a flash memory area. The first polysilicon layer and the first oxide layer are formed at the flash memory area. Thereafter, the second polysilicon layer, the second oxide layer, and a layer of TEOS are formed. The first photo resist is then formed to define the gate pattern of the flash cell array, and then a process of $N^+$ ion implantation is performed to form the source and drain of the flash cell array. After stripping the first photo resist, the second photo resist is formed to define the gate pattern at the NMOS area, and a process of $N^+$ ion implantation is performed to form the NLDD structure. After stripping the second photo resist, the first sidewall is formed, and then a process of $N^-$ ion implantation is performed to form the NMOS source/drain. The third photo resist is then formed to define the gate pattern at the PMOS area. A process of $P^-$ ion implantation is performed to form the PLDD structure, and then the third photo resist is stripped. The second sidewall is formed, and then the fourth photo resist is formed. A process of $P^+$ ion implantation is performed to form the source/drain structure at the PMOS area. Finally, the fourth photo resist is stripped.

36 Claims, 12 Drawing Sheets

METHOD OF FABRICATING A FLASH MEMORY

BACKGROUND OF THE INVENTION (1) Field of the Invention

The present invention relates to a method of fabricating a flash memory, and more particularly to a process for fabricating a flash memory with the advantages of photo masks saving, cost lowing, and throughput improving.

(2) Description of the Related Art

The flash memory is the most potential memory in the semiconductor industry. The flash memory can not only write and erase data, but also store data without volatility. The structure of a flash EEPROM (Flash Electrically Erasable Programmable Read Only memory) is that a floating gate is located between a source and a drain and there is a tunneling oxide layer between the float gate and the substrate. An electric voltage source is provided to push electrons to the floating gate, and a channel will be induced by the electrons in the float gate. The electrons are trapped in the floating gate because of the potential barrier, and are valid for storing data.

Referring now to FIG. 1A to FIG. 1F, a process for fabricating a flash cell array and its peripheral supporting circuits in accordance with a prior art is shown. Two processes of photo masks are needed for forming the gate structure of the flash memories and the peripheral PMOSs and NMOSs. After that, four processes of photo masks are needed for performing the ion implantation processes for NLDD, PLDD, N$^+$, and P$^+$. Firstly, referring now to FIG. 1A, a P-type semiconductor substrate 10, with a flash memory area A, an NMOS area B, and a PMOS area C in an N well 11, is provided. In addition, a layer of pad oxide 12 and a layer of field oxide 13 are also formed on the substrate 10. A polysilicon layer 20 and a dielectric layer 21 with oxide/nitride/oxide (ONO) structure are then formed at the flash memory area A of the substrate 10. The polysilicon layer 20 is going to be the floating gate of the flash memory. After that, a layer of polysilicon 22, a layer of tungsten silicide 23, and a layer of TEOS 24 are formed on the substrate 10 in sequence. The first layer of photo resist 30 is then formed to protect the NMOS area B and the PMOS area C, and to define the gate pattern of the flash cell array. Referring now to FIG. 1B, the gate structure a of the flash cell array is formed by using the method of etching. Thereafter, a process of ion implantation is performed to form the source/drain 31 structure of the flash memory. The first layer of photo resist 30 is then stripped. After that, the second layer of photo resist 40 is formed to define the gate pattern at the NMOS area B and the PMOS area C. The gate structure b at the NMOS area B and the gate structure c at the PMOS area C are formed by using the method of etching. The second layer of photo resist 40 is then stripped.

Referring now to FIG. 1C, the third layer of photo resist 50 is formed to protect the PMOS area C and the flash memory area A, and the NLDD 51 at the NMOS area B is formed by a process of ion implantation 55. The third layer of photo resist 50 is then stripped. Referring now to FIG. 1D, the fourth layer of photo resist 60 is formed to protect the NMOS area B and the flash memory area A, and the PLDD 61 at the PMOS area C is formed by a process of ion implantation 65. The fourth layer of photo resist 60 is then stripped.

Referring now to FIG. 1E, a gate sidewall 90 is formed. After that, a fifth layer of photo resist 70 is formed to protect the PMOS area C and the flash memory area A. A process of ion implantation 75 is then performed to form the source/drain structure 71 at the NMOS area B. The fifth layer of photo resist 70 is then stripped. Referring now to FIG. 1F, a sixth layer of photo resist 80 is formed to protect the NMOS area B and the flash memory area A. A process of ion implantation 85 is performed to form the source/drain structure 81 at the PMOS area C. The sixth layer of photo resist 80 is then stripped. The flash memory and its peripheral NMOSs and PMOSs are then finished.

As mentioned above, in accordance with the prior art, six processes of photo masks are needed to fabricate a flash memory and its peripheral circuits. It is cost-wasting and time-wasting. In accordance with the present invention, only three or four processes of photo masks are needed. The cost could be lowered and the throughput could be improved.

SUMMARY OF THE INVENTION

According, it is a primary object of the present invention to provide a method of fabricating a flash memory with the advantages of photo masks saving, cost lowing, and throughput-improving.

These objects are accomplished by the fabrication process described below. Firstly, a P-type silicon substrate with an N-well, a layer of pad oxide, and a layer of field oxide is divided into a PMOS area, an NMOS area, and a flash memory area. After that, the first polysilicon layer and the first oxide layer are formed at the flash memory area. Thereafter, the second polysilicon layer, the second oxide layer, and a layer of TEOS are formed on the whole substrate. The first layer of photo resist is then formed to define the gate pattern of the flash cell array, and then the first process of N$^+$ ion implantation is performed to form the source and drain of the flash cell array. After stripping the first layer of photo resist, the second layer of photo resist is formed to define the gate pattern at the NMOS area, and then the second process of N$^-$ ion implantation is performed to form the LDD structure at the NMOS area.

After stripping the second layer of photo resist, the first sidewall is formed, and then the third process of N$^+$ ion implantation is performed at the NMOS area to form the NMOS source/drain structure. The third layer of photo resist is then formed to protect the NMOS area and the flash memory area, and the gate pattern at the PMOS area is also defined. Thereafter, the fourth process of P$^-$ ion implantation is performed to form the PLDD structure at the PMOS area, and then the third layer of photo resist is stripped. The second sidewall is formed, and then the fourth layer of photo resist is formed. Thereafter, the fifth process of P$^+$ ion implantation is performed to form the source/drain structure at the PMOS area. Finally, the fourth layer of photo resist is stripped, and the method of manufacturing a flash memory is then finished.

BRIEF DESCRIPTION OF THE DRAWINGS

The accompanying drawings forming a material part of this description, in which.

DESCRIPTION OF THE PREFERRED EMBODIMENTS

Figure 1:
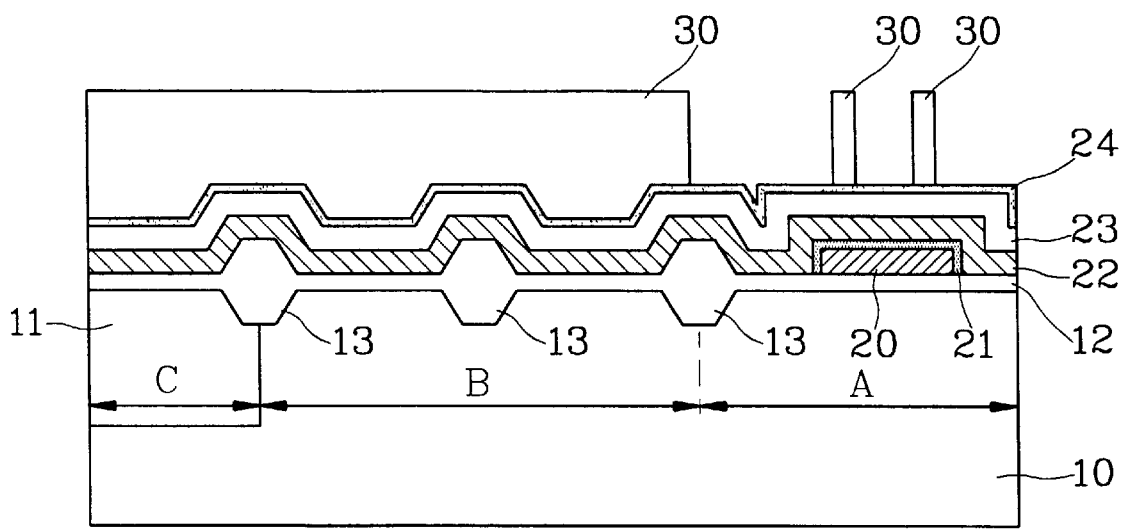
FIGS. 1A to 1E are cross sectional representations of the flash memory and the NMOS and PMOS in the periphery circuits according to the prior arts.
Figure 1:
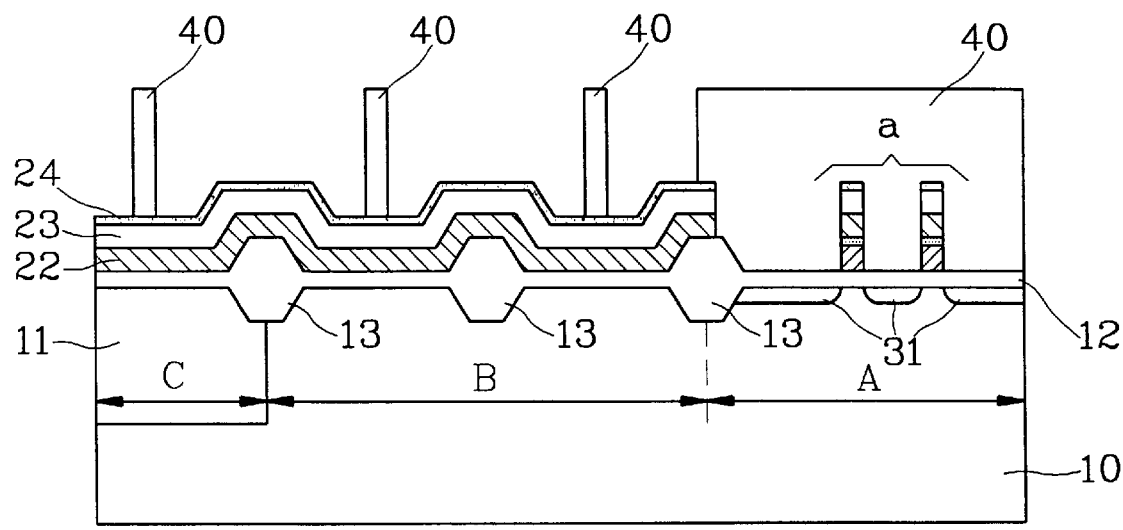
Figure 1:
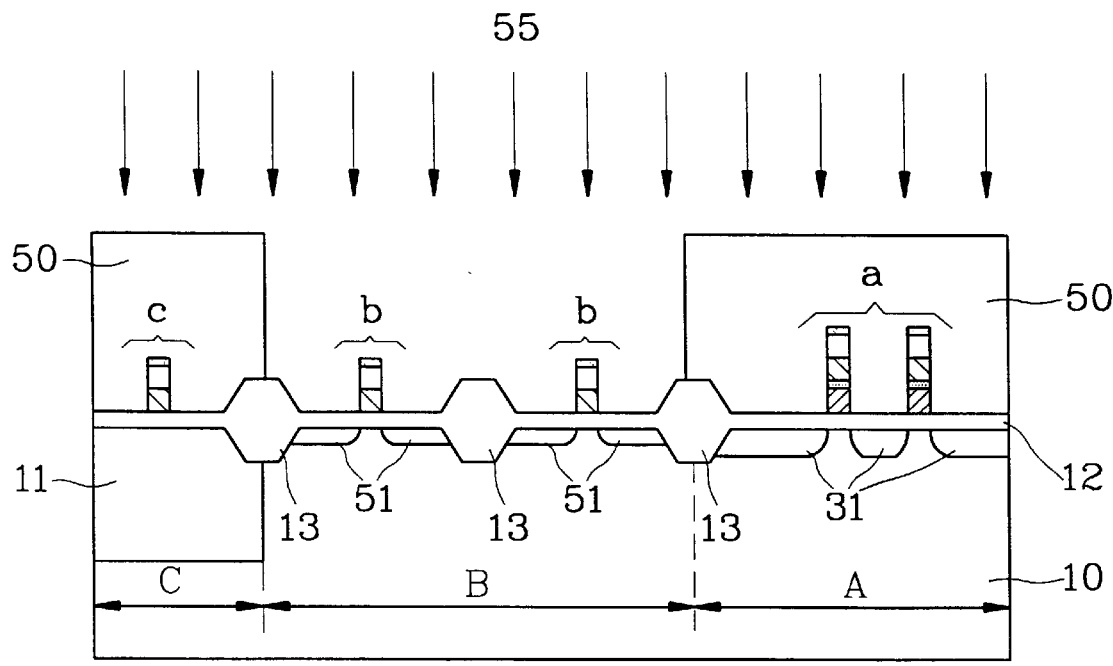
Figure 1:
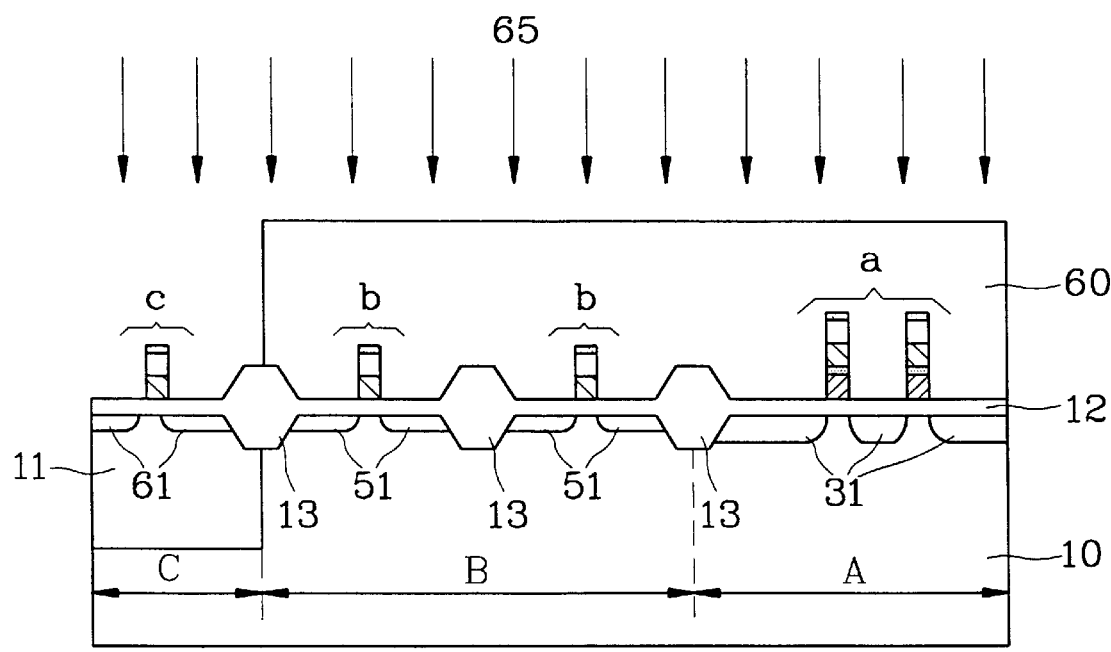
Figure 1:
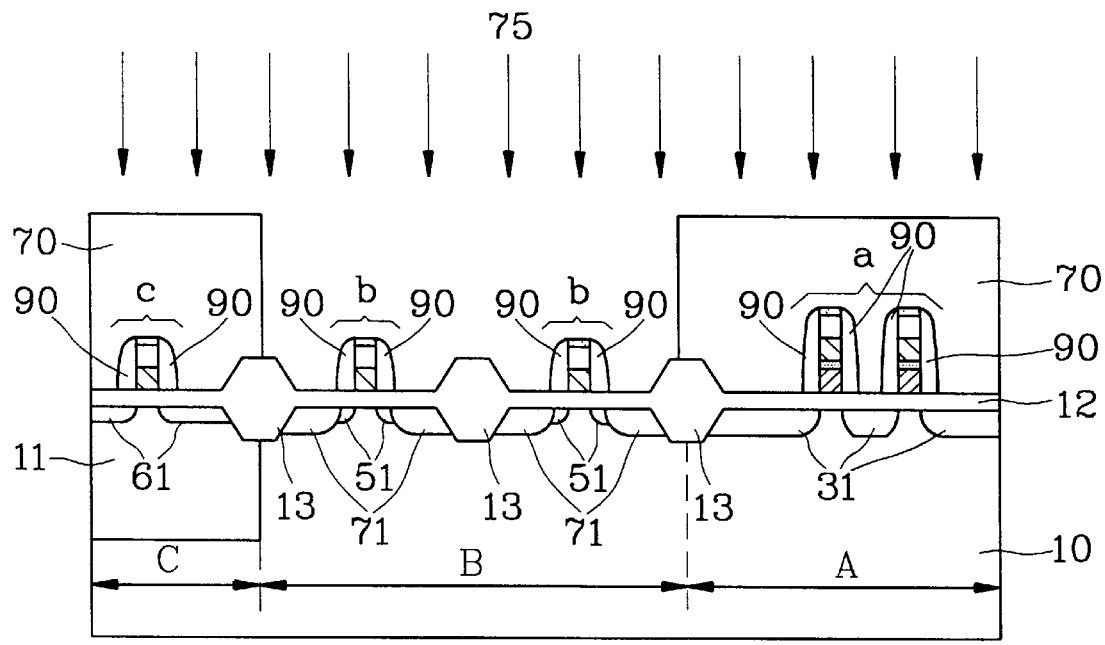
Figure 1:
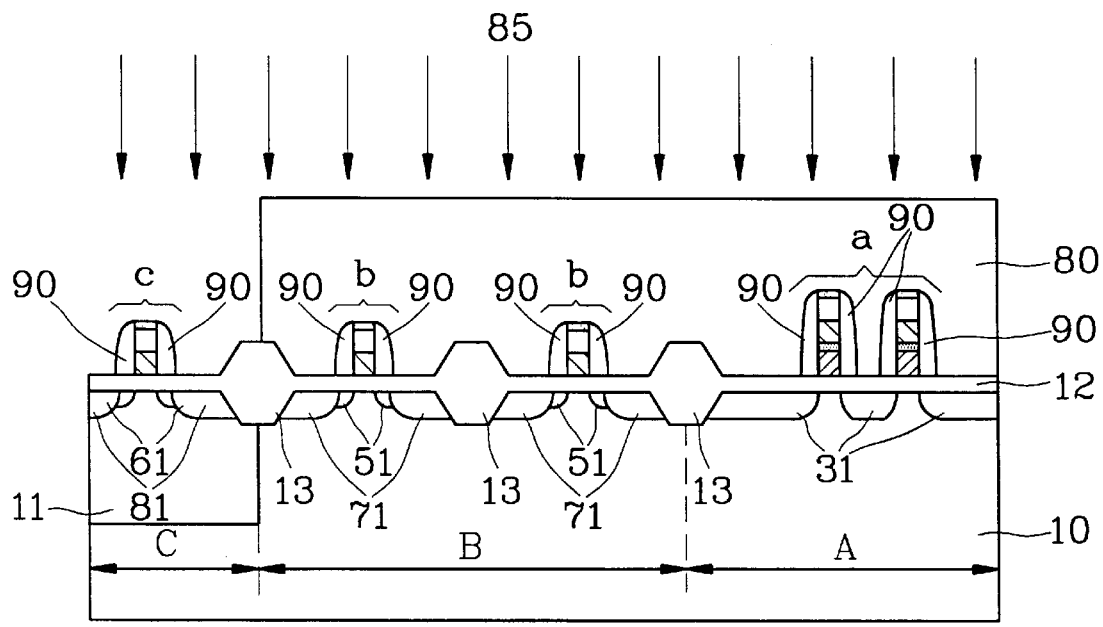

The invention disclosed herein is directed to a method of fabricating a flash memory. The drawing figures are illustrated a partially completed integrated circuit device. In the following description, numerous details are set forth in order to provide a thorough understanding of the present invention. One skilled in the art will appreciate that variations of these specific details are possible while still achieving the results of the present invention. Therefore, the present invention could also be applied for manufacturing EPROM and DDPROM devices. In other instance, well-known processing steps are not described in detail in order not unnecessarily to obscure the present invention.

First Embodiment

FIGS. 2A–2E and FIGS. 3A–3D show a cross-sectional process flow of the front end process and the back end process for the fabrication of a flash memory, respectively. Firstly, referring now to FIG. 2A, a P-type silicon substrate 110 with an N-well 111, a layer of pad oxide 112, and a layer of field oxide 113 is provided by this present invention. This silicon substrate 110 is then divided into a PMOS area C (located in the N-well 111), an NMOS area B, and a flash memory area A. After that, a process of photolithography and a process of etching are performed to form a transistor structure with channels, lightly doped drains (LDD), sources/drains, and gates at each active region.

Please refer to FIG. 2A again. The first polysilicon layer 120 and a dielectric layer with ONO structure 121 are formed at the flash memory area A by using the method of conventional chemical vapor deposition, photolithography, and etching. After that, the second polysilicon layer 122, a layer of tungsten silicide 123, and a layer of TEOS 124 are formed on the whole substrate 110 by using the method of chemical vapor deposition. Thereafter, referring now to FIG. 2B, the first layer of photo resist 130 is formed to protect the NMOS area B and the PMOS area C. The gate pattern of the flash cell array is also defined. After that, referring now to FIG. 2C, a process of etching is performed to form the gate structure a of the flash cell array. The gate structure consists of the layer of TEOS, the layer of tungsten silicide, the polysilicon control gate, the dielectric layer with ONO structure, and the polysilicon floating gate in sequence from top to bottom. The first process of N$^+$ ion implantation is then performed to form the source / drain structure 131 of the flash cell array. After that, the transistor structure at the NMOS area B and the PMOS area C is formed. After stripping the first layer of photo resist 130, the second layer of photo resist 140 is formed to protect the PMOS area C, and also to define the photo resist pattern of the gate structure at the NMOS area B.

Figure 2:
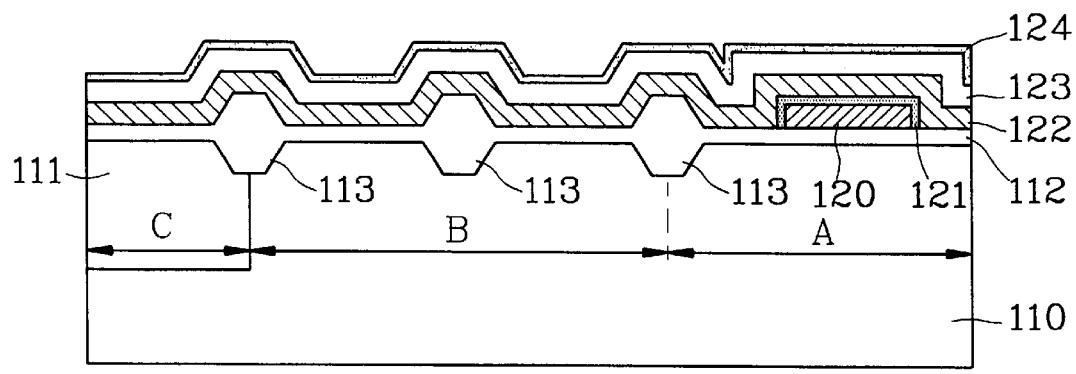
FIGS. 2A to 2E are cross sectional representations of the flash memory and the NMOS and PMOS in the periphery circuits according to the front end process of the first, the second, and the third embodiments of the present invention.
Figure 2:
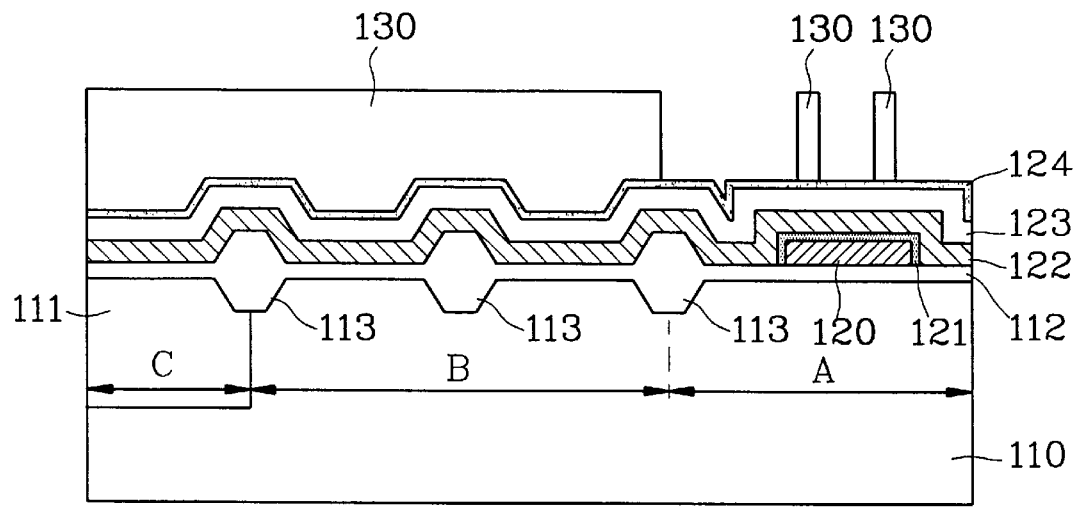
Figure 2:
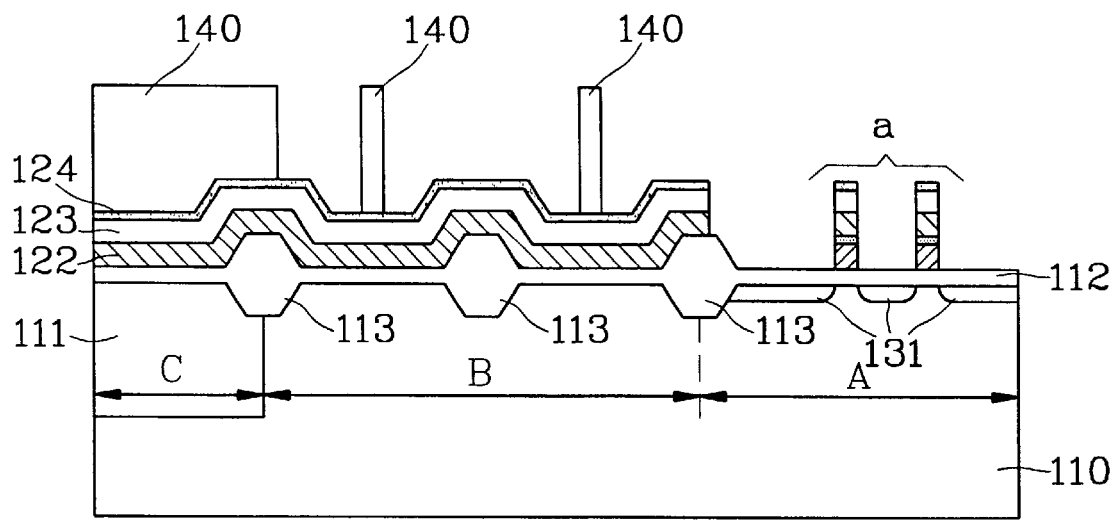
Figure 2:
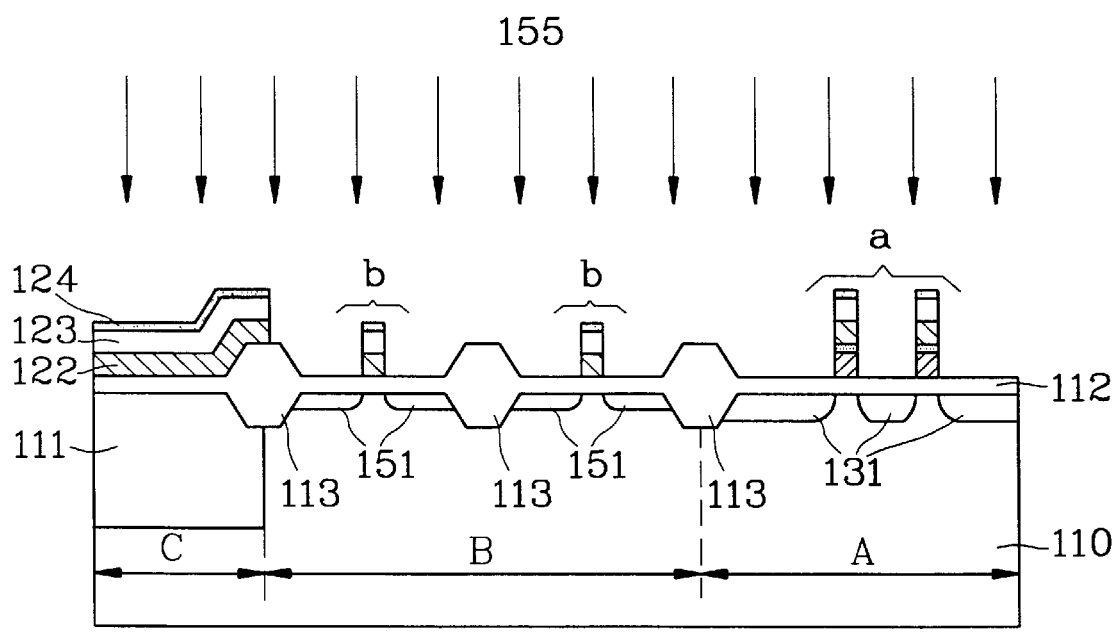
Figure 2:
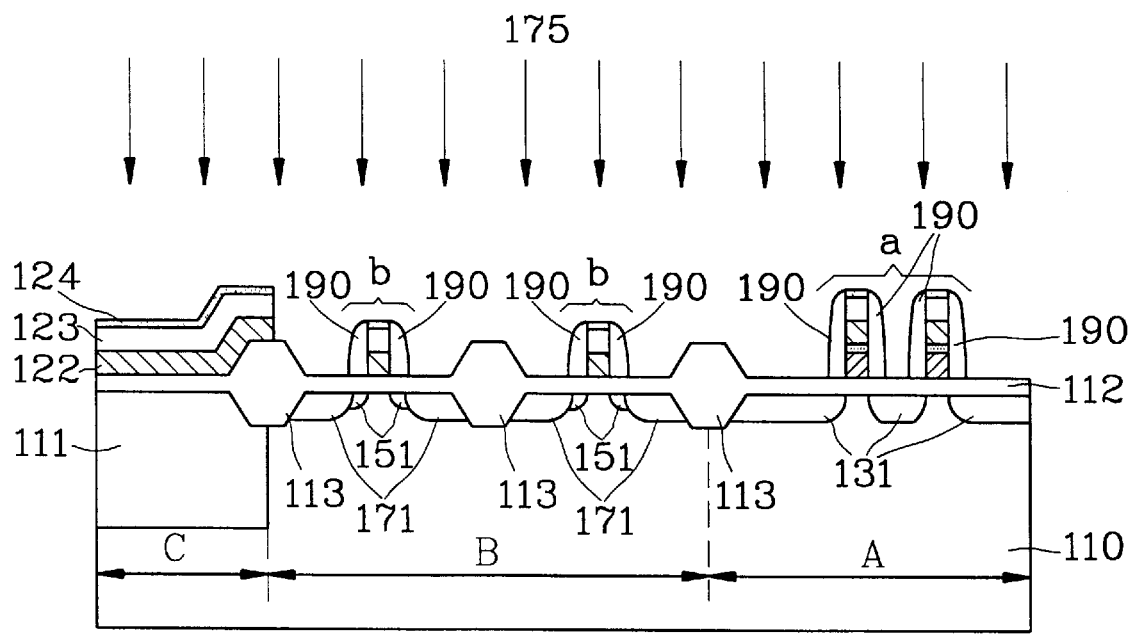

Referring now to FIG. 2D, the gate structure b at the NMOS area B is formed by using the method of etching. The gate structure b consists of a layer of TEOS, a layer of tungsten silicide, and a layer of polysilicon in sequence from top to bottom. After stripping the second layer of photo resist 140, the second process of N– ion implantation 155 is then performed to form the LDD structure 151 at the NMOS area B. The ion implantation uses phosphorous (P) as ion source. Referring now to FIG. 2E, the first sidewall 190 is formed by using the conventional deposition and etching processes for forming a sidewall. The first sidewall 190 could be formed from a layer of TEOS, a layer of plasma enhanced oxide, or a layer of nitride. After that, the third process of N$^+$ ion implantation 175 is then performed at the NMOS area B to form the NMOS source/drain structure 171. The third process of N$^+$ ion implantation uses arsenic (As) as ion source.

Figure 3:
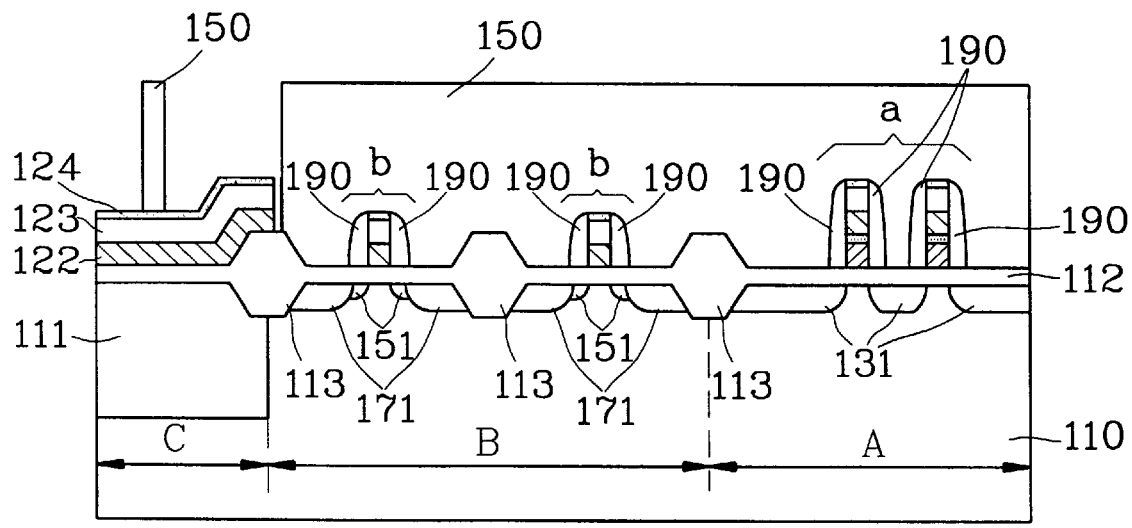
FIGS. 3A to 3D are cross sectional representations of the flash memory and the NMOS and PMOS in the periphery circuits according to the back end process of the first embodiment of the present invention.
Figure 3:
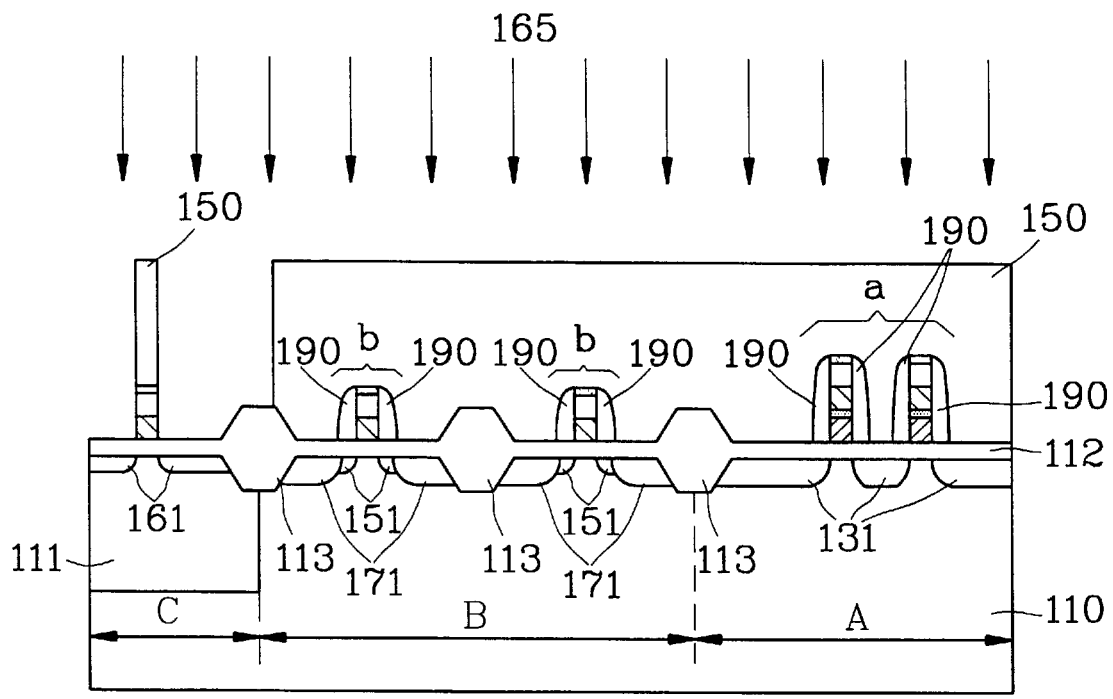
Figure 3:
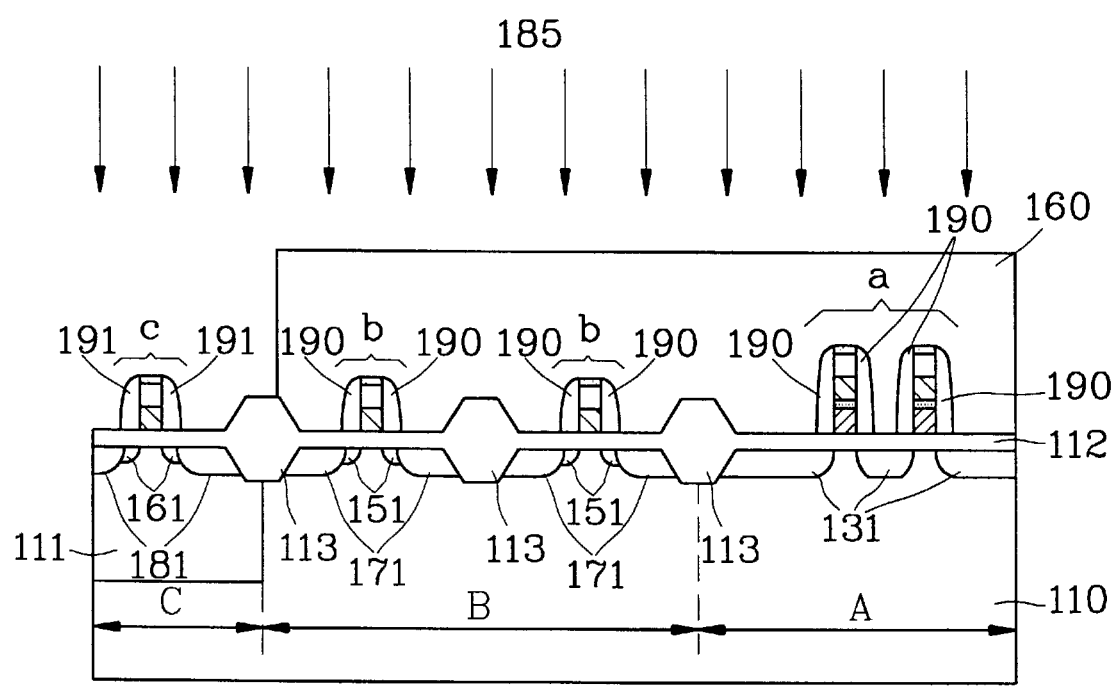
Figure 3:
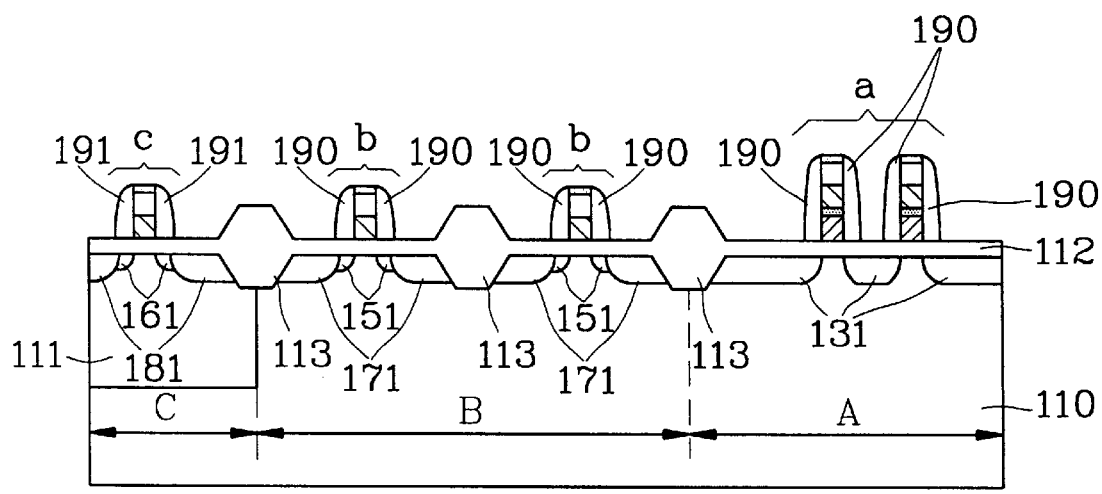

Referring now to FIG. 3A, the third layer of photo resist 150 is formed to protect the NMOS area B and the flash memory area A, and the gate pattern at the PMOS area C is also defined. Referring now to FIG. 3B, the gate structure c at the PMOS area C is formed by using the method of etching. The gate structure c consists of a layer of TEOS, a layer of tungsten silicide, and a layer of polysilicon in sequence from top to bottom. Thereafter, the fourth process of P– ion implantation 165 is performed to form the PLDD structure 161 at the PMOS area C. The fourth process of P$^-$ ion implantation uses BF$_2$ as ion source. After stripping the third layer of photo resist 150, the second sidewall 191 is formed by using the conventional deposition and etching processes for forming a sidewall. The second sidewall 191 could be formed from a layer of TEOS, a layer of plasma enhanced oxide, or a layer of nitride. After that, the fourth layer of photo resist 160 is formed to cover the NMOS area B and the flash memory area A. Thereafter, the fifth process of P$^+$ ion implantation 185 is performed to form the source/drain structure 181 at the PMOS area C. The fifth process of P+ ion implantation uses BF$_2$ as ion source, as shown in FIG. 3C. Finally, the fourth layer of photo resist 160 is stripped, as shown in FIG. 3D. In accordance with the first embodiment of the present invention, the method of manufacturing a flash memory is then finished.

Second Embodiment

Using the second embodiment could also operate the present invention. The front end process of the second embodiment is totally the same with that of the first embodiment. Please refer to the descriptions about FIG. 2A to FIG. 2E in the first embodiment for more details.

Figure 4:
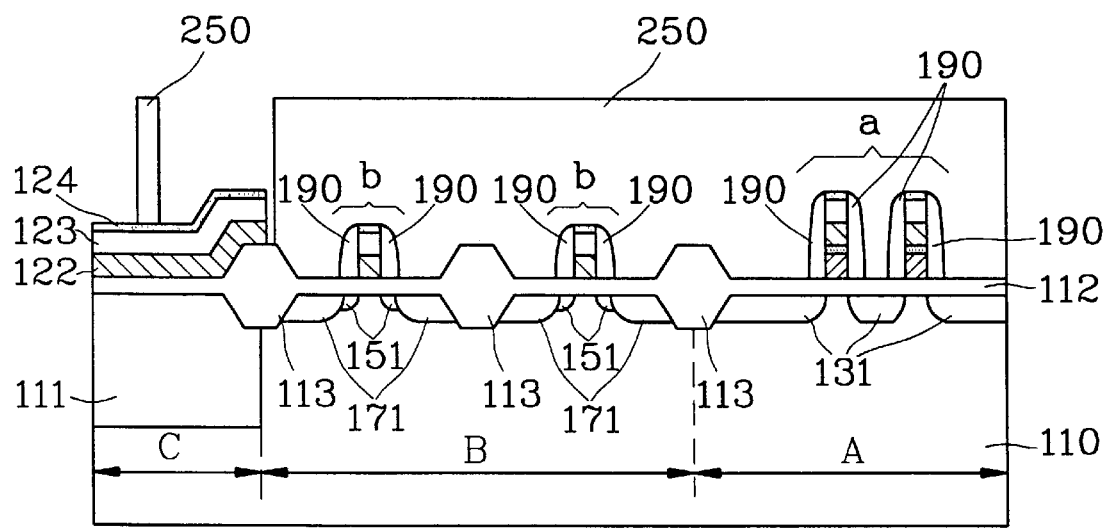
FIGS. 4A to 4D are cross sectional representations of the flash memory and the NMOS and PMOS in the periphery circuits according to the front end process of the second embodiment of the present invention.
Figure 4:
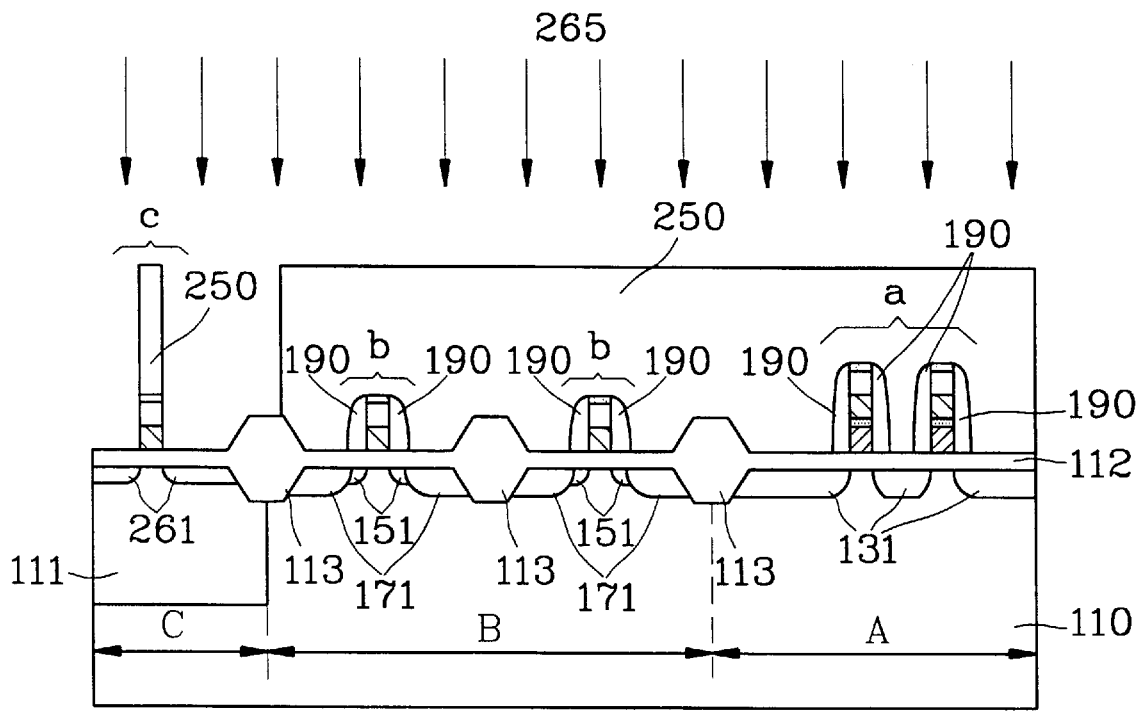
Figure 4:
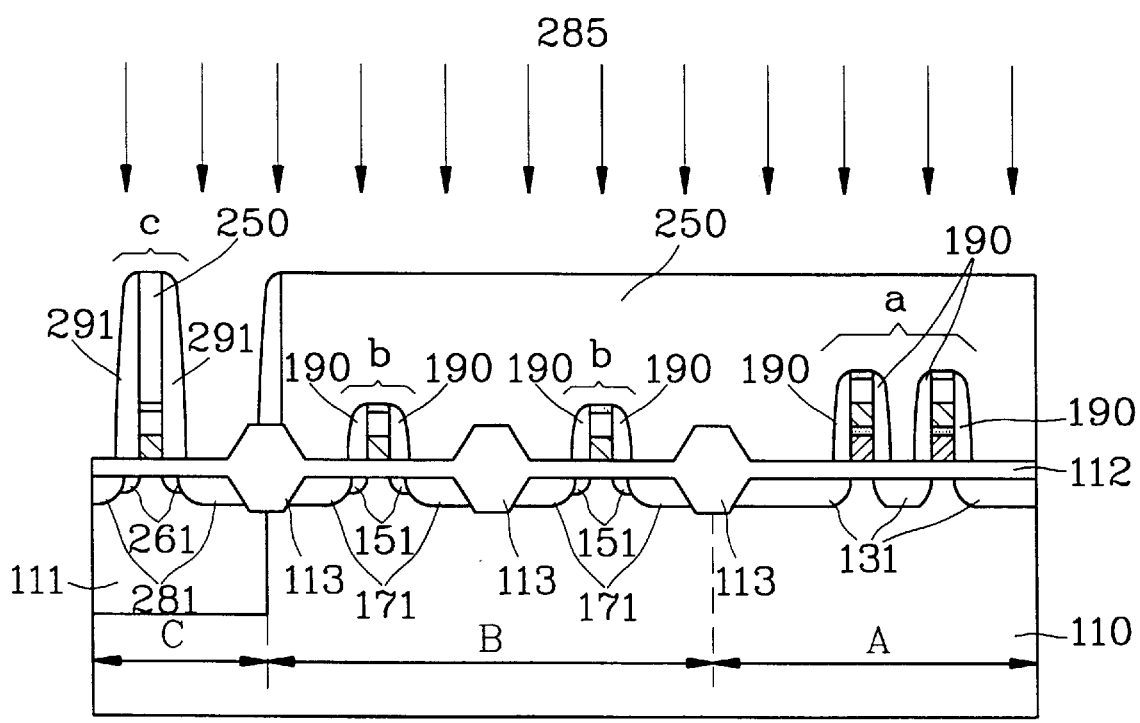
Figure 4:
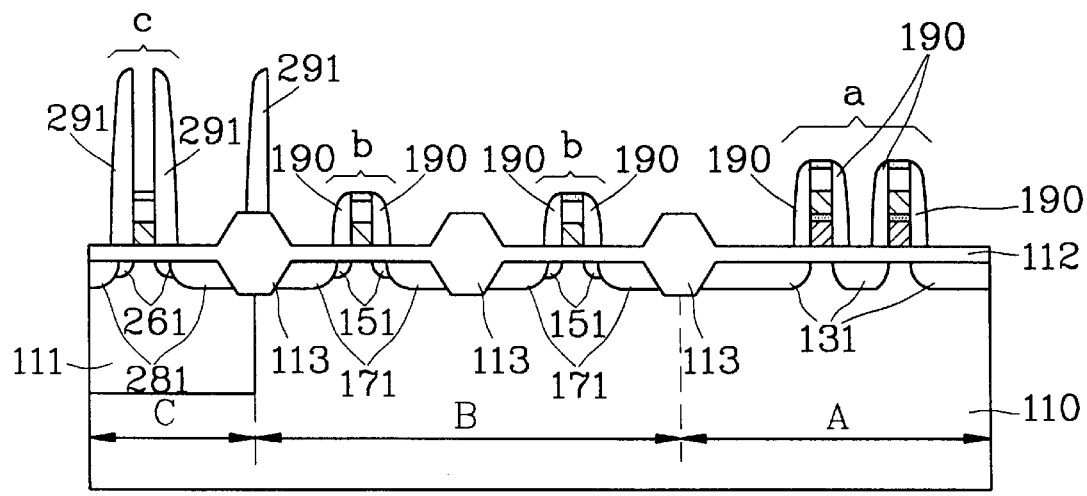

Referring now to FIG. 4A, the third layer of photo resist 250 is formed to protect the NMOS area B and the flash memory area A, and the gate pattern at the PMOS area C is also defined. Referring now to FIG. 4B, the gate structure c at the PMOS area C is formed by using the method of etching. The gate structure c consists of a layer of TEOS, a layer of tungsten silicide, and a layer of polysilicon in sequence from top to bottom. Thereafter, the fourth process of P$^-$ ion implantation 265 is performed to form the PLDD structure 261 at the PMOS area C. The fourth process of P$^-$ ion implantation uses BF$_2$ as ion source. Thereafter, the second sidewall 291 is formed by using the conventional deposition and etching processes for forming a sidewall, as shown in FIG. 4C. The second sidewall 291 could be formed from a layer of low temperature TEOS. Thereafter, the fifth process of P$^+$ ion implantation 285 is performed to form the source/drain structure 281 at the PMOS area C. The fifth process of P$^+$ ion implantation uses BF$_2$ as ion source. Finally, the third layer of photo resist 250 is stripped, as shown in FIG. 4D. In accordance with the second embodiment of the present invention, the method of manufacturing a flash memory is then finished.

The front end process of the second embodiment is totally the same with that of the first embodiment. However, in accordance with the second embodiment, the third layer of photo resist 250 is stripped after the sidewall 291 is formed and the fifth process of ion implantation 285 is performed. There are only three processes of photo masks in accordance with the second embodiment.

Third Embodiment

Using the third embodiment could also operate the present invention. The front end process of the third embodiment is totally the same with that of the first embodiment. Please refer to the descriptions about FIG. 2A to FIG. 2E in the first embodiment for more details.

Figure 5:
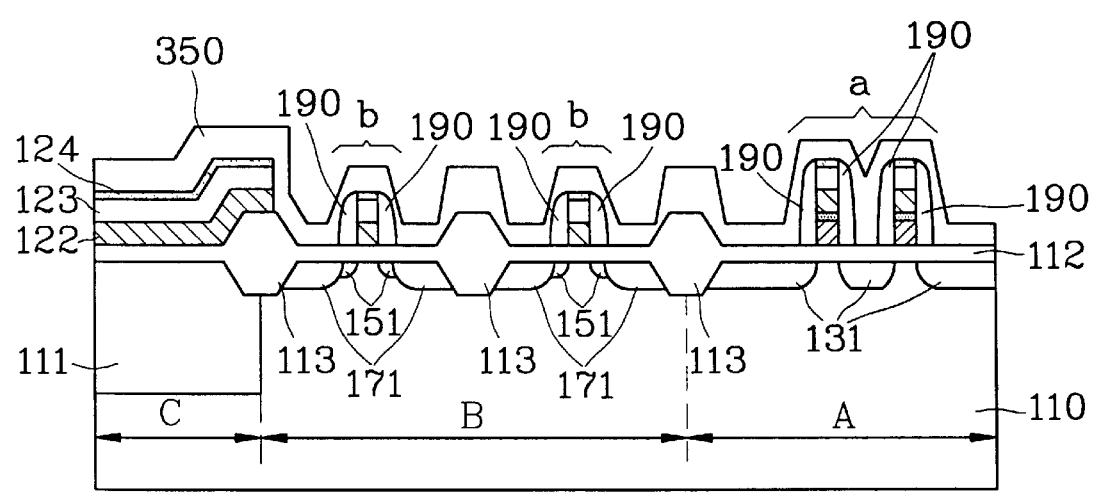
FIGS. 5A to 5D are cross sectional representations of the flash memory and the NMOS and PMOS in the periphery circuits according to the front end process of the third embodiment of the present invention.
Figure 5:
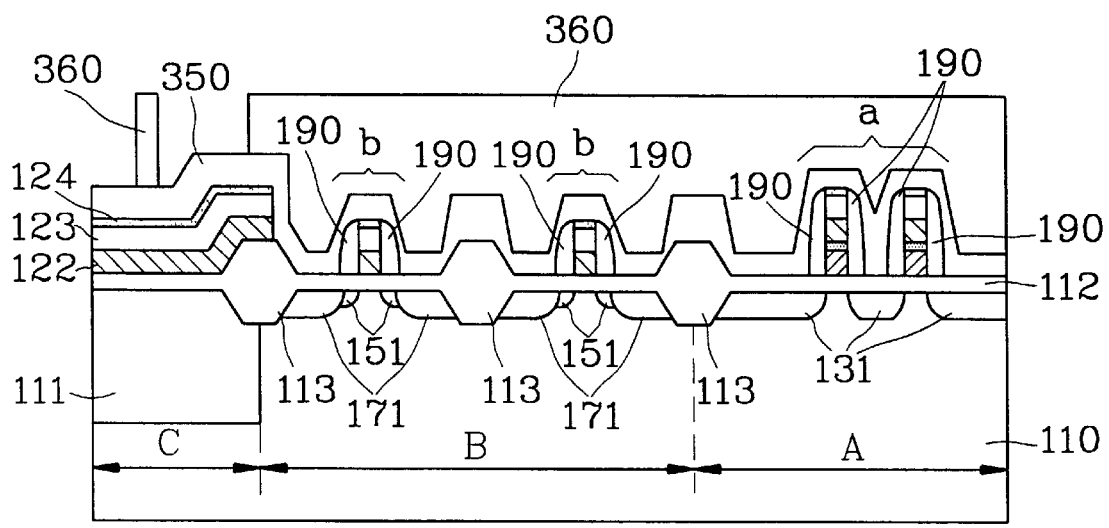
Figure 5:
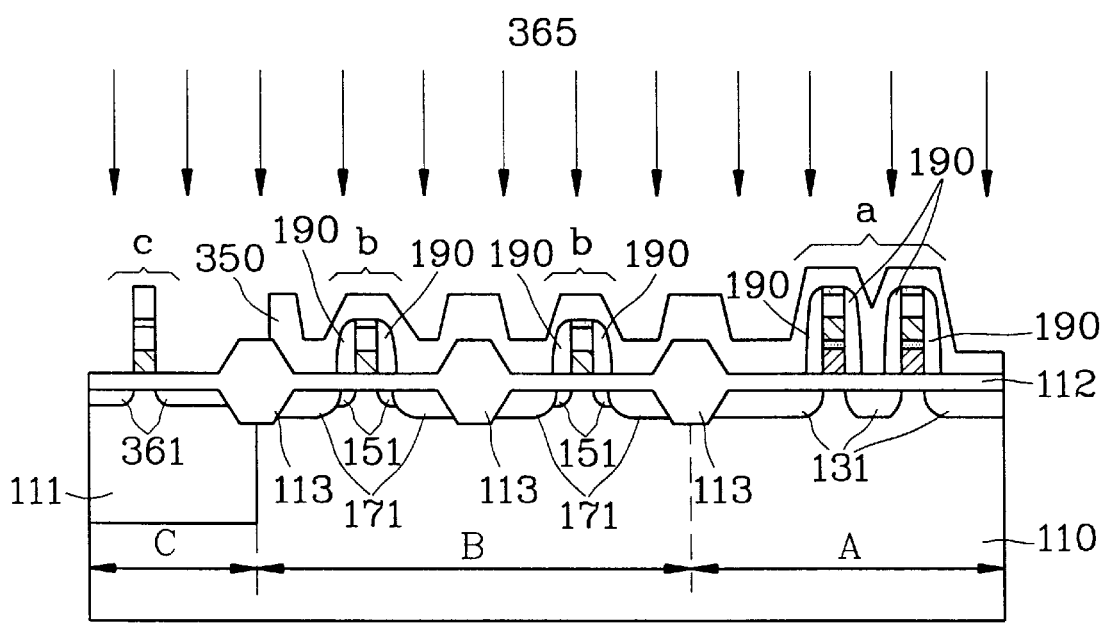
Figure 5:
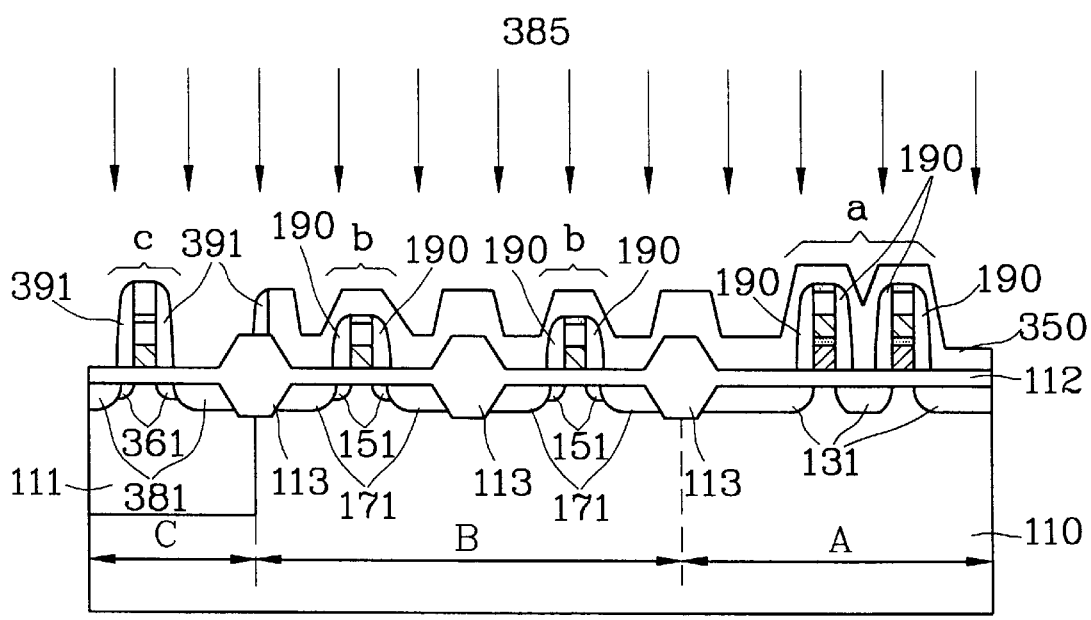

Referring now to FIG. 5A, a layer of nitride 350 is formed on the whole substrate 110. Referring now to FIG. 5B, the third layer of photo resist 360 is formed to protect the NMOS area B and the flash memory area A, and the gate pattern at the PMOS area C is also defined. Referring now to FIG. 5C, the gate structure c at the PMOS area C is formed by using the method of etching. The gate structure c consists of a layer of TEOS, a layer of tungsten silicide, and a layer of polysilicon in sequence from top to bottom. The third layer of photo resist 360 is then stripped. Thereafter, the layer of nitride 350 is used as a hard mask to perform the fourth process of P$^-$ ion implantation 365 to form the PLDD structure 361 at the PMOS area C. The fourth process of P$^-$ ion implantation uses BF$_2$ as ion source. Thereafter, the second sidewall 391 is formed by using the conventional deposition and etching processes for forming a sidewall, as shown in FIG. 5D. The second sidewall 391 could be formed from a layer of TEOS or a layer of plasma enhanced oxide. Thereafter, the fifth process of P$^+$ ion implantation 385 is performed to form the source/drain structure 381 at the PMOS area C. The fifth process of P$^+$ ion implantation uses BF$_2$ as ion source. In accordance with the third embodiment of the present invention, the method of manufacturing a flash memory is then finished.

The front end process of the third embodiment is totally the same with that of the first and the second embodiment. However, in accordance with the third embodiment, a layer of nitride 350 is formed before the third layer of photo resist 360 is formed to define the gate structure c at PMOS area. As a result, the third layer of photo resist 360 could be stripped before the third process of ion implantation, and the layer of nitride 350 could be used to be a hard mask for protecting the NMOS area B and the flash memory area A. Therefore, there are only three processes of photo masks in accordance with the third embodiment.

As mentioned above, the present invention provides a process to manufacture flash memories and the PMOSs and NMOSs in the periphery circuits by using only three or four processes of photo masks. Compared to the prior arts using six processes of photo masks, the present invention could save two or three processes of photo masks. Therefore, the present invention could lower the cost and improve the throughput of production.

While the invention has been particularly shown and described with reference to the preferred embodiments, it will be understood by those skilled in the art that various changes in form and detail may be made therein without departing from the spirit and scope of the present invention.

What we claimed is:

1. A method of fabricating a flash memory, said method comprising the steps of:

(a) providing a P-type semiconductor substrate with an N well and a layer of field oxide, wherein said P-type semiconductor substrate is divided into an NMOS area, a PMOS area in said N well, and a flash memory area;

(b) forming a first layer of polysilicon and a first dielectric layer at said flash memory area;

(c) forming a second layer of polysilicon, a layer of tungsten silicide, and a layer of TEOS on said semiconductor substrate in sequence;

(d) forming a first layer of photo resist to protect said NMOS area and said PMOS area, and then forming a gate structure of a flash cell array at said flash memory area;

(e) performing a first process of ion implantation to form a source/drain structure of said flash cell array;

(f) stripping said first layer of photo resist;

(g) forming a second layer of photo resist to protect said PMOS area, and then forming a gate structure at said NMOS area;

(h) stripping said second layer of photo resist;

(i) performing a second process of ion implantation to form a lightly doped drain (LDD) structure at said NMOS area;

(j) forming a first sidewall;

(k) performing a third process of ion implantation to form a source/drain structure at said NMOS area;

(l) forming a third layer of photo resist to protect said NMOS area and said flash memory area, and then forming a gate structure at said PMOS area;

(m) performing a fourth process of ion implantation to form a lightly doped drain (LDD) structure at said PMOS area;

(n) stripping said third layer of photo resist;

(o) forming a second sidewall;

(p) forming a fourth layer of photo resist to protect said NMOS area and said flash memory area, and performing a fifth process of ion implantation to form a source/drain structure at said PMOS area; and (q) stripping said fourth layer of photo resist.

2. The method of claim 1, wherein said first dielectric layer is in a structure of oxide/nitride/oxide (ONO).

3. The method of claim 1, wherein said first layer of polysilicon is formed by using the method of chemical vapor deposition.

4. The method of claim 1, wherein said second layer of polysilicon is formed by using the method of chemical vapor deposition.

5. The method of claim 1, wherein said layer of tungsten silicide is formed by using the method of chemical vapor deposition.

6. The method of claim 1, wherein said layer of TEOS is formed by using the method of chemical vapor deposition.

7. The method of claim 1, wherein said second process of ion implantation uses phosphorous as ion source.

8. The method of claim 1, wherein said first sidewall is made from a layer of TEOS, a layer of plasma enhanced oxide, or a layer of nitride.

9. The method of claim 1, wherein said third process of ion implantation uses arsenic as ion source.

10. The method of claim 1, wherein said fourth process of ion implantation uses BF$_2$ as ion source.

11. The method of claim 1, wherein said second sidewall is made from a layer of TEOS, or a layer of plasma enhanced oxide.

12. The method of claim 1, wherein said fifth process of ion implantation uses BF$_2$ as ion source.

13. A method of fabricating a flash memory, said method comprising the steps of:

(a) providing a P-type semiconductor substrate with an N well and a layer of field oxide, wherein said P-type semiconductor substrate is divided into an NMOS area, a PMOS area in said N well, and a flash memory area;

(b) forming a first layer of polysilicon and a first dielectric layer at said flash memory area;

(c) forming a second layer of polysilicon, a layer of tungsten silicide, and a layer of TEOS on said semiconductor substrate in sequence;

(d) forming a first layer of photo resist to protect said NMOS area and said PMOS area, and then forming a gate structure of a flash cell array at said flash memory area;

(e) performing a first process of ion implantation to form a source/drain structure of said flash cell array;

(f) stripping said first layer of photo resist;

(g) forming a second layer of photo resist to protect said PMOS area, and then forming a gate structure at said NMOS area;

(h) stripping said second layer of photo resist;

(i) performing a second process of ion implantation to form a lightly doped drain (LDD) structure at said NMOS area;

(j) forming a first sidewall;

(k) performing a third process of ion implantation to form a source/drain structure at said NMOS area;

(l) forming a third layer of photo resist to protect said NMOS area and said flash memory area, and then forming a gate structure at said PMOS area;

(m) performing a fourth process of ion implantation to form a lightly doped drain (LDD) structure at said PMOS area;

(n) forming a second sidewall;

(o) performing a fifth process of ion implantation to form a source/drain structure at said PMOS area; and (p) stripping said third layer of photo resist.

14. The method of claim 13, wherein said first dielectric layer is in a structure of oxide/nitride/oxide (ONO).

15. The method of claim 13, wherein said first layer of polysilicon is formed by using the method of chemical vapor deposition.

16. The method of claim 13, wherein said second layer of polysilicon is formed by using the method of chemical vapor deposition.

17. The method of claim 13, wherein said layer of tungsten silicide is formed by using the method of chemical vapor deposition.

18. The method of claim 13, wherein said layer of TEOS is formed by using the method of chemical vapor deposition.

19. The method of claim 13, wherein said second process of ion implantation uses phosphorous (P) as ion source.

20. The method of claim 13, wherein said first sidewall is made from a layer of TEOS, a layer of plasma enhanced oxide, or a layer of nitride.

21. The method of claim 13, wherein said third process of ion implantation uses arsenic (As) as ion source.

22. The method of claim 13, wherein said fourth process of ion implantation uses $BF_2$ as ion source.

23. The method of claim 13, wherein said second sidewall is made from a layer of low temperature TEOS.

24. The method of claim 13, wherein said fifth process of ion implantation uses BF2 as ion source.

25. A method of fabricating a flash memory, said method comprising the steps of:

(a) providing a P-type semiconductor substrate with an N well and a layer of field oxide, wherein said P-type semiconductor substrate is divided into an NMOS area, a PMOS area in said N well, and a flash memory area;

(b) forming a first layer of polysilicon and a first dielectric layer at said flash memory area;

(c) forming a second layer of polysilicon, a layer of tungsten silicide, and a layer of TEOS on said semiconductor substrate in sequence;

(d) forming a first layer of photo resist to protect said NMOS area and said PMOS area, and then forming a gate structure of a flash cell array at said flash memory area;

(e) performing a first process of ion implantation to form a source/drain structure of said flash cell array;

(f) stripping said first layer of photo resist; (g) forming a second layer of photo resist to protect said PMOS area, and then forming a gate structure at said NMOS area;

(h) stripping said second layer of photo resist;

(i) performing a second process of ion implantation to form a lightly doped drain (LDD) structure at said NMOS area;

(j) forming a first sidewall;

(k) performing a third process of ion implantation to form a source/drain structure at said NMOS area;

(l) forming a layer of nitride to cover said semiconductor substrate;

(m) forming a third layer of photo resist to protect said NMOS area and said flash memory area, and then forming a gate structure at said PMOS area;

(n) stripping said third layer of photo resist;

(o) performing a fourth process of ion implantation by using said layer of nitride as a hard mask to form a lightly doped drain (LDD) structure at said PMOS area;

(p) forming a second sidewall; and (q) performing a fifth process of ion implantation to form a source/drain structure at said PMOS area.

26. The method of claim 25, wherein said first dielectric layer is in a structure of oxide/nitride/oxide (ONO).

27. The method of claim 25, wherein said first layer of polysilicon is formed by using the method of chemical vapor deposition.

28. The method of claim 25, wherein said second layer of polysilicon is formed by using the method of chemical vapor deposition.

29. The method of claim 25, wherein said layer of tungsten silicide is formed by using the method of chemical vapor deposition.

30. The method of claim 25, wherein said layer of TEOS is formed by using the method of chemical vapor deposition.

31. The method of claim 25, wherein said second process of ion implantation uses phosphorous (P) as ion source.

32. The method of claim 25, wherein said first sidewall is made from a layer of TEOS, a layer of plasma enhanced oxide, or a layer of nitride.

33. The method of claim 25, wherein said third process of ion implantation uses arsenic (As) as ion source.

34. The method of claim 25, wherein said fourth process of ion implantation uses $BF_2$ as ion source.

35. The method of claim 25, wherein said second sidewall is made from a layer of TEOS, or a layer of plasma enhanced oxide.

36. The method of claim 25, wherein said fifth process of ion implantation uses $BF_2$ as ion source.

* * * * *